United States Patent [19]
Holcomb

[11] Patent Number: 5,155,431
[45] Date of Patent: Oct. 13, 1992

[54] VERY FAST AUTOSCALE TOPOLOGY FOR DIGITIZING OSCILLOSCOPES

[75] Inventor: Matthew S. Holcomb, Colorado Springs, Colo.

[73] Assignee: Hewlett-Packard Company, Palo Alto, Calif.

[21] Appl. No.: 651,674

[22] Filed: Feb. 6, 1991

[51] Int. Cl.⁵ .................... G01R 13/00; G01R 15/08
[52] U.S. Cl. ................... 324/121 R; 324/115; 364/487
[58] Field of Search ................ 324/103 P, 115, 116, 324/121 R; 364/487; 315/364

[56] References Cited

U.S. PATENT DOCUMENTS

| | | | |
|---|---|---|---|
| 3,798,604 | 3/1974 | Kuipers et al. | 324/121 R |
| 4,364,027 | 12/1982 | Murooka | 324/121 R |
| 4,399,512 | 8/1983 | Soma et al. | 324/121 R |
| 4,482,861 | 11/1984 | Jalovec et al. | 324/77 D |
| 4,704,691 | 11/1987 | Blair | 364/487 |
| 4,713,771 | 12/1987 | Crop | 364/487 |
| 4,716,345 | 12/1987 | Shank et al. | 364/487 |
| 4,719,416 | 1/1988 | DeSautels | 364/487 |
| 4,743,844 | 5/1988 | Odenheimer et al. | 324/115 |
| 4,743,845 | 5/1988 | Diller et al. | 364/487 |

Primary Examiner—Ernest F. Karlsen
Assistant Examiner—William J. Burns

[57] ABSTRACT

A very fast autoscale feature can be implemented in a digitizing oscilloscope by using dedicated peak detector hardware [14] capable of operating at the maximum sampling rate of the A/D converter [12] to determine the minimum and maximum values of said input signal, in combination with a trigger counter [24, 26] to count the number of trigger events in the analog input signal. While in the autoscale mode, the oscilloscope microprocessor [22] can then set the appropriate scale and offset for the Y-axis of the display as a function of the maximum and minimum values determined by the peak detector [14] and set the sweep rate as a function of the count provided by the tripper counter [26].

6 Claims, 2 Drawing Sheets

VERY FAST AUTOSCALE TOPOLOGY FOR DIGITIZING OSCILLOSCOPES

BACKGROUND OF THE INVENTION

1. Field of the Invention

The present invention relates generally to the field of digitizing oscilloscopes. More specifically, the present invention discloses an apparatus to provide a very fast autoscale or automatic setup feature for a digitizing oscilloscope.

2. Statement of the Problem

Digitizing oscilloscopes often have an autoscale or automatic setup feature that is used to automatically analyze the input signals connected to the oscilloscope, and then set the sweep speed and vertical sensitivity settings appropriately to best display these input signals. The traditional approach used by conventional digitizing oscilloscopes has been a software oriented technique. For example, the internal microprocessor in the oscilloscope would be used to execute an algorithm similar to the following:

1. Set each input channel to minimum gain sensitivity.
2. Digitize and collect untriggered waveform records for each input channel (typically one sample is stored for each series of N samples digitized by the A/D converter), and then parse through each record looking for a first-pass estimate of the input signal maximum and minimum values. If the signal is yet to small, increase the gain sensitivity and repeat, as needed.
3. Choose a trigger source from the input channels with activity, and set the trigger level for that channel appropriately.
4. Again, collect waveform records for each channel using triggered acquisitions, starting at the fastest available sweep speeds.

4Parse through these records, noting signal extremes and input frequency. Adjust the channel gain and sweep speed accordingly, and repeat as needed.

Unfortunately, this software approach has a number of shortcomings. First, the algorithm described above is often quite slow. The microprocessor often needs to search through quite a bit of data. For example, consider the task of determining the maximum and minimum vales of the following signal during an autoscale operation:

| | |
|---|---|
| Maximum A/D sample rate: | $10^7$ samples/sec. |
| Waveform record length: | 1000 points |
| Input signal: | square wave |
| Frequency | 100 KHz |
| Width | 200 nsec. |

Using the conventional approach, the microprocessor scales the A/D sampling rate to 100 KHz (i.e., 1/100th of the maximum A/D sample rate), the collects 10 mS, 1000 point untriggered records. The microprocessor then watches through these records searching for input signal extremes. Since the time resolution between stored samples is 1/100 KHz = 10 μs, it will be necessary to repeat this process at least 10 μs / 200 nsec = 50 times before being reasonably certain that the minimum and maximum values have been found.

The conventional approach also requires the microprocessor to start the search for the appropriate sweep speed at the fastest possible timebase setting to prevent signal aliasing (i.e., a situation where the signal digitized and displayed by the oscilloscope bears no real relationship to the input signal). Starting with the fastest sweep rate, triggered data acquisitions are taken and the microprocessor searches through the resulting data looking for signal edges to estimate the input signal frequency. Since the microprocessor operates on digitized samples, care must be taken to avoid signal aliasing, which may occur whenever the input signal frequency is above the Nyquist limit as determined by the effective store rate of digitized samples into memory. Thus, the conventional approach typically requires numerous repetitions of the sampling process at progressively decreasing sweep rates until the input signal frequency is known.

Second, this approach is prone to errors, or to miss signals entirely. Since the algorithm is rather slow, the input signal can change quite substantially during the autoscale operation. The algorithm may make certain decisions based on input signals at the start of the search that could be quite invalid several seconds later. Worse yet, low duty cycle signals could be entirely missed. In other words, at slower sweep speeds the acquisition system typically throws away far more samples from the A/D converter than it stores and displays. A very low duty cycle is quite likely to be contained in this ignored data.

3. Solution to the Problem

The present invention improves upon conventional d . oscilloscopes by adding global peak detecting logic capable of running at the maximum A/D sampling rate (e.g. 10 MHz), and by adding a trigger counter at the hardware level to eliminate the edge finding process heretofore done in software by the microprocessor. Since the peak detector operates at the same frequency as the A/D converter, each and every sample is tested for signal extremes and only one pass is required. This is in contrast to the conventional oversampling approach in which only one sample is stored in memory for later processing by the microprocessor out of each series of N samples produced by the A/D converter. As outlined above, the conventional oversampling approach typically requires numerous repetitions of the sampling process to ensure that accurate maximum and minimum value have been found. In addition, even the fastest microprocessor would be many times slower at interpreting stored data than would be the case for dedicated peak detecting circuitry analyzing samples on the fly.

The trigger counter substantially eliminates the problem of signal aliasing that accompanies the conventional approach. Here, the edge finding process is done directly by hardware. Qualified trigger events are directly used to clock the trigger counter. Since this trigger signal is never digitized, all possibility of signal aliasing is eliminated. The oscilloscope microprocessor simply resets the trigger counter, waits a predetermined period of time, and then reads the resulting count. The conventional approach of repeated data acquisitions and processing by the microprocessor to estimate the input signal frequency is completely eliminated.

These improvements allow a digitizing oscilloscope to achieve a substantial improvement in the amount of time required to autoscale. Prototypes of the present invention have seen time periods of up to 10 seconds reduced to fractions of a second (using four input channels, over 50 Hz to 100 MHz).

SUMMARY OF THE INVENTION

This invention provides a means of implementing a very fast autoscale feature in a digitizing oscilloscope. Dedicated peak detector hardware capable of operating at the maximum sampling rate of the A/D converter is used to determine the minimum and maximum values of said input signal. In addition, a trigger counter is employed to count the number of trigger events in the analog input signal. While in the autoscale mode, the oscilloscope microprocessor can then set the appropriate scale and offset for the Y-axis of the display as a function of the maximum and minimum values determined by the peak detector and set the sweep rate as a function of the count provided by the trigger counter.

A primary object of the present invention is to provide a means of substantially decreasing the amount of time required for the autoscale feature for digitizing oscilloscopes.

Another object of the present invention is to substantially reduce the possibility of signal aliasing that may result when using the autoscale feature.

These and other advantages, features, and objects of the present invention will be more readily understood in view of the following detailed description and the drawings.

BRIEF DESCRIPTION OF THE DRAWINGS

The present invention can be more readily understood in conjunction with the accompanying drawings, in which.

DETAILED DESCRIPTION OF THE INVENTION

Figure 1:
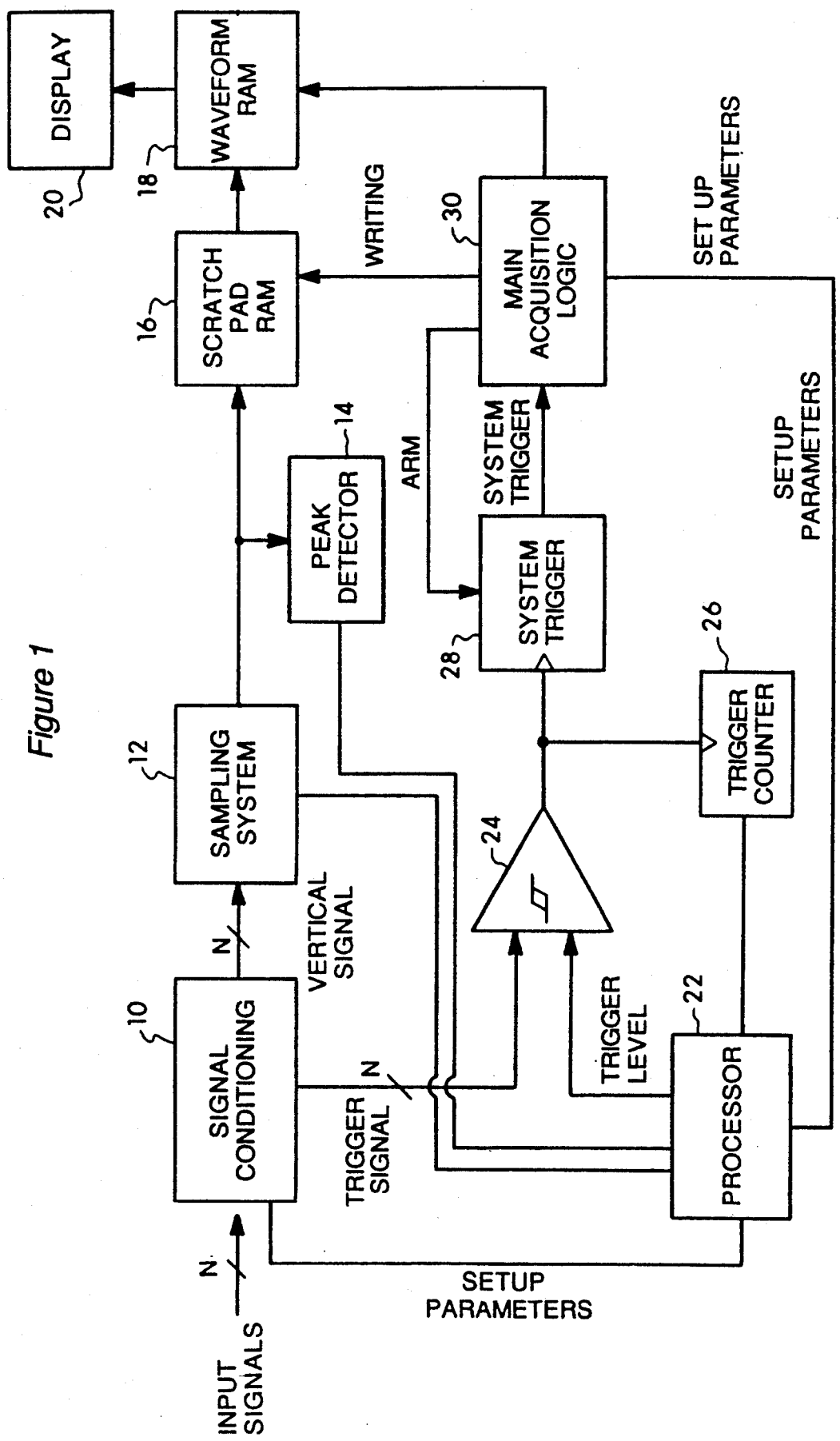
FIG. 1 is a schematic block diagram of a digitizing oscilloscope incorporating the present invention.

Turning to FIG. 1., a schematic block diagram of a digitizing oscilloscope incorporating the present invention is disclosed. A digitizing oscilloscope typically has a number of channels for analog input signals. The resulting oscilloscope display is a summed composite of the input signals. However, any of the input channels may be selected to provide triggering for the display. The analog input signals are initially fed through a signal conditioning block 10 that provides analog signal processing of the input signals in accordance with certain setup parameters set by the processor 22. For example, in the preferred embodiment of the present invention, the signal conditioning block 10 is capable of amplifying the input signal by a gain factor set by the processor 22, and is also capable of adding a DC component to the input signal determined by the processor 22. These setup parameters can be used by the processor 22 to control the scale (vertical sensitivity) and offset of the Y-axis of the oscilloscope display 20, respectively. The analog signals output by the signal conditioning block 10 are used both to generate the vertical (i.e. Y-axis) signal, and as the trigger signal to control the timing and sweep along the X-axis of the oscilloscope display 20.

The vertical signal is repeatedly sampled by the sampling system 12 at a frequency determined by the system clock (or alternatively by the processor 22). The sampling system 12 has a conventional analog-to digital ("A/D") convertor which outputs a series a digitized samples at the sampling frequency.

Figure 2:
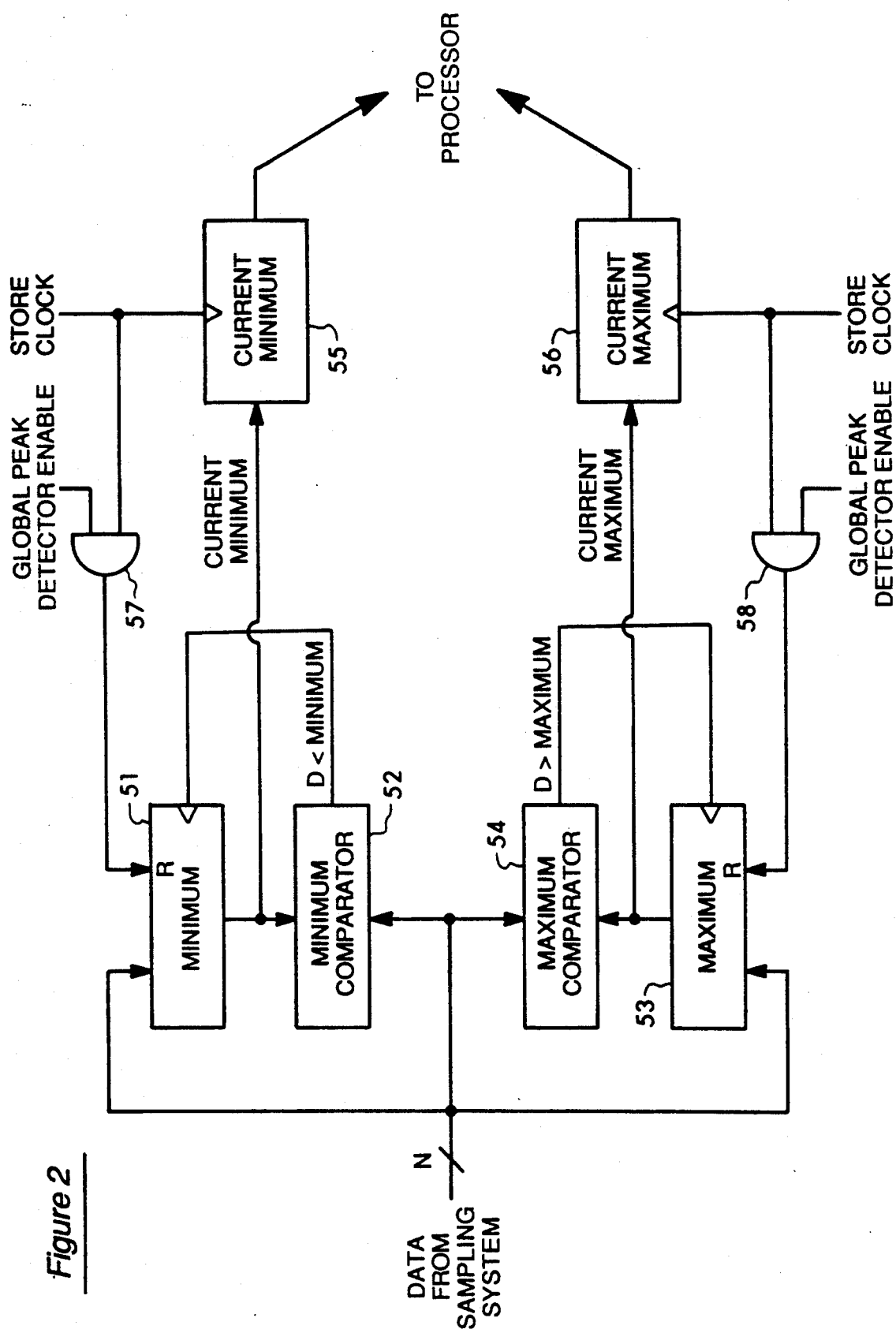
FIG. 2 is a schematic block diagram of global peak detecting logic.

The digitized samples from the sampling system 12 are received by the peak detector 14 which determines the maximum and minimum values contained within the samples during any period of time specified by the processor 22. FIG. 2 provides a block diagram of one embodiment of the peak detector 14. Each digitized sample from the sampling system 12 is compared by the minimum comparator 52 against the existing minimum stored in the minimum register 51. If the sample is less than the existing minimum, the minimum comparator 52 triggers the minimum register 51 to store the sample as the new minimum value. Similarly, each digitized sample from the sampling system 12 also is compared by the maximum comparator 54 against the existing maximum stored in the maximum register 53. If the sample is greater than the existing maximum, the maximum comparator 54 triggers the maximum register 53 to store the sample as the new maximum value. These current minimum and maximum values are stored at each clock pulse by the current minimum register 55 and the current maximum register 56, respectively, to be accessed by the processor 22. The processor 22 can trigger and reset the peak detector 14 by enabling the AND gates 57 and 58 which reset the minimum register 51 and the maximum register 53. This permits the processor 22 to determine the extreme values of the input signal for any desired period of time. The processor 22 enables the AND gates 57 and 58 at the start of the period, and then reads the values from the current minimum register 55 and the current maximum register 56 at the end of the desired time period.

Each of the digitized samples are also presented at the input of the scratch pad RAM 16. Storage of samples into memory is controlled by the main acquisition logic 30. The oscilloscope display 20 can be considered as a rectilinear grid of pixies. The number of pixels along the X-axis of the display usually determines the number of samples to stored in the scratch pad RAM 16 for each frame of data to be displayed by the oscilloscope. Since the sampling frequency of the sampling system is quite high (e.g. 10 MHz), only one sample is stored in the scratch pad ram from each series of N samples produced by the sampling system 12, where N is an integer typically much greater than one. The main acquisition logic 30 takes the samples stored in the scratch pad RAM 16 and converts them to a form suitable for display by the waveform RAM 18 and display unit 20.

The conditioned analog input signals from the signal conditioning block 10 are also used as the trigger signal by the trigger comparator 24 (e.g. a Schmidt trigger) which outputs a signal indicative of whether the trigger signal is greater than a trigger level set by the processor 22. Each time the trigger signal rises above the trigger level defines a "trigger event."

A trigger counter 26 counts the number of rises in the output signal from the trigger comparator 24 (i.e. the number of trigger events). The processor 22 can use the trigger counter 26 to count the number of trigger events during any desired temporal period by first resetting the trigger counter 26 at the start of the period, and then reading the count from the trigger counter 26 at the end of the period.

The system trigger 28 is used for the purpose of helping to maintain a consistent X-axis origin between successive frames of data displayed on the oscilloscope screen by starting each frame at a trigger event. The system trigger 28 is armed by the main acquisition logic 30 prior to each display frame. The system trigger 28 then detects the next trigger event which is used to define the X-axis origin for the display frame.

The processor 22 is capable of multiple modes of operation. If the user has not selected the autoscale feature, the processor reads the operational settings (e.g. Y-axis scale, X-axis sweep rate, input channel selection, etc.) entered by the user via the manual controls for the oscilloscope and provides setup parameters to the signal conditioning block 10 and main acquisition logic 30 in accordance with these manual settings. Alternatively, if the user has selected the autoscale feature, the processor first enters an autoscale mode to automatically determine setup parameters to best display the input signals connected to the oscilloscope, and then enters a display mode in which the input signals are displayed using these setup parameters.

The algorithm used by the processor 22 in the autoscale mode generally follows the following sequence of steps:

1. Initialize the setup parameters for the signal conditioning block 10 (e.g. gain and offset), and enable the peak detector 14.
2. Wait a predetermined period of time.
3. Read the minimum and maximum value from the peak detector 14.
4. If the maximum and minimum values provided by the peak detector 14 indicate that the input signal is being clipped high or low, but not both (i.e. the maximum value is greater than or equal to a predetermined upper limit, or the minimum value is lesser than or equal to a predetermined lower limit), adjust the offset accordingly and loop to step 2.
5. If the input signal is being clipped both high and low, decrease the gain and loop to step 2.
6. If the amplitude of the input signal (maximum minimum) is less than a predetermined minimal limit, increase the gain and loop to step 2. (If the gain has reached its maximum, this indicates there is no significant input signal activity, and algorithm should be terminated.)
7. Set the trigger source to the desired input signal channel.
8. Clear the trigger counter 26.
9. Wait a predetermined period of time.
10. Read the number of trigger events counted by the trigger counter 26.
11. Set the sweep rate in proportion to the number of triggers events counted (i.e., set the value of N as an inverse function of the number of trigger events so that a greater fraction of the samples produced by the sampling system 12 are stored and displayed for higher frequency input signals).

During the subsequent display mode, the setup parameters provided by the processor 22 remain fixed. The main acquisition logic 30 controls the routine processing of digitized samples for each display frame by arming the system trigger and waiting for the system trigger at the start of each display frame; causing the scratch pad RAM 16 to store 1-in-N samples output by the sampling system 12; and performing any graphic transformations necessary convert the samples stored by the scratch pad RAM 16 into a form usable for display by the waveform RAM 18 and display unit 20.

It should be noted that the embodiment shown in FIG. 1 and discussed above has a separate processor 22 and main acquisition logic 30. In this embodiment, the processor 22 can be a conventional microprocessor, while the main acquisition logic can either be implemented by dedicated digital logic or by a second microprocessor. Alternatively. the functions of the processor 22 and the main acquisition logic 30 can be combined in a single microprocessor serving as a display control system. However, use of separate dedicated main acquisition logic 30 offers a substantial advantage in operating speed in most situations.

The above disclosure sets forth a number of embodiments of the present invention. Other arrangements or embodiments, not precisely set forth, could be practiced under the teachings of the present invention and as set forth in the following claims.

I claim:

1. A digitizing oscilloscope comprising:
   sampling means for receiving an analog input signal and outputting digitized samples of said input signal at a predetermined sampling frequency;
   peak detector means for determining the minimum and maximum values f said samples;
   display means having an X-axis and a Y-axis, for displaying a visual representation of said input signal by plotting a predetermined plurality of said samples along said X-axis, where said plotted samples re chosen by selecting one sample from each series of N samples from said sampling means, had where N is an integer greater than one;
   trigger counter means for counting the number of times said input signal exceeds a predetermined trigger level; and
   display control means having an autoscale mode for fixing th scale and offset of the Y-axis of said display means as a function of the maximum and minimum values determined by said peak detector means within a predetermined temporal period during said autoscale mode, and for fixing the value of N as a function of the count of said trigger counter means within a predetermined temporal period during said autoscale mode.

2. The digitizing oscilloscope of claim 1, further comprising signal conditioning means controlled by said display control means for providing predetermined analog signal processing of said analog input signal before said signal is output to said sampling means, and thereby permitting said display control means to effectively control the scale and offset of said Y-axis of said display.

3. Th digitizing oscilloscope of claim 2, wherein said signal conditioning means amplifies said input signal y a gain factor adjustably determined by said display control mans to thereby effectively control said scale.

4. The digitizing oscilloscope of claim 2, wherein said signal conditioning means adds to said input signal a DC component adjustably determined by said display control means to thereby effectively control said offset.

5. The digitizing oscilloscope of claim 1, wherein said display control means comprise a microprocessor.

6. A digitizing oscilloscope comprising:
   signal conditioning means for receiving and amplifying an analog input signal by an adjustable gain factor, and for adding an adjustable DC component to said input signals;
   sampling means for receiving said conditioned input signal, and outputting digitized samples of said signal at a predetermined sampling frequency;
   peak detector means for determining the minimum and maximum values of said samples;
   a memory for storing a selected plurality of said samples, storage of the current sample produced by said sampling means being triggered by a control signal;
an oscilloscope display for displaying a visual presentation of said stored samples;
trigger comparator means for outputting a signal indicative of whether said conditioned input signal is greater than a predetermined trigger level;
trigger counter means for receiving said output signal from said trigger comparator, and for counting the number of times said input signal exceeds a predetermined trigger level during a predetermined temporal period; and
display control means having:
  (a) a display mode wherein said display control means triggers said memory to store one sample from each series of N samples from said sampling means, and where N is an integer greater than one; and
  (b) an autoscale mode wherein said display control means fixes the gain factor and DC component of said signal conditioning means as a function of the maximum and minimum values determined by said peak detector means within a temporal period selected by said display control means, and fixes the value of N subsequently used during said display mode as a function of the count of said trigger counter means within a temporal period selected by said display control means.

* * * * *